United States Patent [19]
Liu

[11] Patent Number: 5,473,562
[45] Date of Patent: Dec. 5, 1995

[54] METHOD AND APPARATUS FOR MINIMIZING POWER-UP CROWBAR CURRENT IN A RETARGETABLE SRAM MEMORY SYSTEM

[75] Inventor: Pin-Wu Liu, Saratoga, Calif.

[73] Assignee: VLSI Technology, Inc., San Jose, Calif.

[21] Appl. No.: 286,292

[22] Filed: Aug. 5, 1994

[51] Int. Cl.⁶ .................................................. G11C 7/00
[52] U.S. Cl. ........................ 365/154; 365/156; 365/207; 365/208; 365/230.03
[58] Field of Search ................................ 365/154, 156, 365/230.03, 207, 208, 189.02, 230.02

[56] References Cited

U.S. PATENT DOCUMENTS

| | | | |
|---|---|---|---|
| 4,926,384 | 5/1990 | Roy | 365/230.03 |
| 4,958,326 | 9/1990 | Sakurai | 365/230.03 X |
| 4,989,184 | 1/1991 | Kishida | 365/208 |
| 5,276,650 | 1/1994 | Kubota | 365/207 |

Primary Examiner—David C. Nelms
Assistant Examiner—Son Mai
Attorney, Agent, or Firm—Flehr, Hohbach, Test, Albritton & Herbert

[57] ABSTRACT

A retargetable SRAM system includes several block storage units that include a plurality of addressably selectable SRAM core cells, with a block single ended bit line driver coupleable to the output of each block storage unit to enhance voltage slew rate. To promote retargetability, digital (rather than analog) sense amplifiers are provided per each data output port. To minimize power-up crowbar current, the input of each unselected block bit line driver is forced to a "1" or "0" state. A MOS transistor coupled between the input port of each block bit line driver and an upper or lower system power supply has its gate input lead coupled to receive the system block select signal (or its complement). A desired SRAM core cell is accessed by specifying its row, column, and block address. A row select signal causes the cell output to be coupled to the input of the associated block bit line driver. The block select signal, its complement, and column select signal cause the output of the associated block bit line driver to be coupled to the input of the digital sense amplifier for the specified data output. The same block select signal (or its complement) turns on the MOS transistor coupled to the input node of each unselected block bit line driver. In a system with SRAM core cells arrayed into 128 rows and 256 columns, partitioned into four block storage units of 32 rows each, crowbar current is thus minimized for the 3×256 or 768 unselected block bit line drivers.

18 Claims, 6 Drawing Sheets

METHOD AND APPARATUS FOR MINIMIZING POWER-UP CROWBAR CURRENT IN A RETARGETABLE SRAM MEMORY SYSTEM

FIELD OF THE INVENTION

The invention relates to retargetable digital memory systems in general, and more specifically to reducing power-up crowbar current in a retargetable SRAM memory system.

BACKGROUND OF THE INVENTION

Static random access memory ("SRAM") systems are commonly used to store digital information in a computer system. Such memory systems are static in that information is stored in a plurality of latch-type core cells, without a need to dynamically refresh a store charge (as is the case for dynamic random access memory systems). Because there is no refresh cycle, SRAMs are relatively fast, with access times in the 12 ns to 15 ns range, or less.

FIG. 1 depicts an SRAM system 2 that typically is fabricated on an integrated circuit ("IC") chip. Generally system 2 includes several blocks, e.g., elements 4, 6, 8, 10, of storage units, wherein each block includes a plurality of latch-type memory cells. (Of course, fewer or more than four blocks may be present.) The individual core memory cells comprising each block are arrayed in addressable rows and columns, for example, 128 rows and 256 columns. Thus, for the configuration of FIG. 1, where four blocks are present, each block could contain 32 rows and 256 columns of cells.

To address a given memory cell within a block, system 2 provides row and block decoder logic 12 (for decoding a desired row address and block), and also provides column decoder logic 14 (for decoding a desired column address). Control logic 16 receives various control signals such as chip enable ($\overline{CE}$), write enable ($\overline{WE}$) and output enable ($\overline{OE}$), which signals are coupled to the memory array blocks, e.g., 4, 6, 8, 10. These memory blocks also receive a block select (BK) signal and a word line select (WL) signal from row and block decoder 12.

Data to be written or stored within one or more memory cells are received by an input buffer 18, and then passed onto the desired memory cells within the blocks of memory via a write bit line. Reading information from a desired memory cell is accomplished by addressing that cell's row and column, and by coupling the cell to a sense amplifier 20. Sense amplifier 20 senses whether a "1" or a "0" is stored within the addressed cell, and provides the proper "0" or "1" output signal to an output buffer 22. The output port of buffer 22 provides a data output signal that is coupled to an I/O buss.

Conventionally, sense amplifier 20 is an analog device that receives a pair of differential analog input signals from complementary bit lines coupled across the memory cell being read. Such analog sense amplifiers function similarly to an analog differential amplifier. When the voltage difference between the sense amplifier input signals is sufficient in magnitude, the sense amplifier will output a "0" or a "1" signal, representing the data stored within the accessed memory cell. Partially because they can detect the proper "0" or "1" state of the stored data from differential signals that need not transition from full "0" to "1" values (or vice versa), analog sense amplifiers can function rapidly. Unfortunately, because analog sense amplifiers are very susceptible to design changes that can affect the sense amplifier trip point, in general, they cannot be used in retargetable SRAM systems.

A goal of modern SRAM design is that the system be retargetable. By retargetable it is meant that the design, once written in various software design files, may be duplicated using different fabrication processes and/or different technologies. For example, a present design based upon a minimum metal-on-semiconductor ("MOS") transistor gate width of say 0.8 µm may in the future be capable of implementation using newer 0.5 µm technology.

In a retargetable SRAM design, it would suffice to input to the software files different scaling information. For example, if a MOS transistor of unit dimension size previously used 0.8 µm geometry, it should suffice to instruct the general technology software files that the unit dimension is now 0.5 µm, whereupon new fabrication masks and layout will be generated. Ideally the resultant scaled-down IC SRAM system should function without substantial redesign.

Unfortunately, the presence of analog sense amplifiers 20 makes system 2 essentially non-retargetable. For example, implementing the sense amplifiers with differently sized MOS transistors and/or simply coupling the sense amplifier to differently sized MOS transistors can affect the trip point voltage at which the sense amplifier changes state. While possibly the sense amplifier and/or components to which it is coupled could be redesigned, having to do so is unacceptable in a truly retargetable SRAM system design.

Although analog sense amplifiers do not contribute to a retargetable SRAM memory system, their presence at least tends to prohibit excessive crowbar current when operating voltage is first coupled to the system ("power-up"). As used herein, "crowbar current" refers to DC current that may be drawn in a system during power-up.

What is needed is a method of implementing a retargetable SRAM memory system. Preferably such method should avoid the use of analog sense amplifiers but should nonetheless provide rapid signal sense capability. Further, such method should minimize crowbar current at system power-up.

The present invention provides such a method and apparatus.

SUMMARY OF THE PRESENT INVENTION

The present invention provides a retargetable static random access memory (SRAM) system that includes a plurality of block storage units that each include a plurality of SRAM core cells whose cell contents are read with a digital sense amplifier.

Each core cell associated with a block storage unit may be addressably selected for reading or writing a digital bit storable within the core cell. Preferably the core cells are arrayed in addressable rows and columns, e.g., 128 rows by 256 columns, with each storage block unit containing a like number of the rows, for example 32 rows if four storage block units are used. Accessing a given core cell involves specifying its block, row and column number. Partitioning the system into blocks of core cells reduces somewhat the buss load capacitance seen by the input of the digital sense amplifier, thus somewhat improving voltage slewing.

To further improve voltage slewing, a block bit line driver unit preferably is provided for each block storage unit. The block bit line drivers are single-ended units coupled in series between the upper and lower power supplies for the system.

A row pass MOS transistor is series-coupled between the output of each SRAM core cell and the input of the associated block bit line driver. Specifying that core cell's row number in a word line signal causes its row pass MOS transistor to turn on, coupling the core cell contents to the input of the block bit line driver unit.

The output port of each block bit line driver is coupled to the input port of a block select transmission gate, whose output port is coupled to the input port of a column select transmission gate. The output from the column select transmission gate is presented to the input of a single-ended digital sense amplifier for the column. Because the sense amplifier is digital, retargetability of the system is promoted as no design critical changes concerning the sense amplifier trip point are required upon retargeting.

To minimize crowbar current, a pull-up PMOS transistor or a pull-down NMOS transistor is coupled between the input of each block bit line driver and an upper or a lower power supply, respectively. As is common the art, the lower power supply is often system ground. Alternatively, the pull-up and pull-down transistors may be coupled between the input of each block bit line driver and a "1" or a "0" level DC voltage, respectively. The block select signal (or its complement) is coupled to the gate lead of each pull-up or pull-down transistor. The result is that the input port of each unselected block bit line driver is pulled up to a "1" or pulled down to a "0" level, which minimizes crowbar current during system power-up. In this fashion, crowbar current in all unselected block bit line drivers is minimized.

The pull-up or pull-down transistor coupled to the selected block is not turned on. This permits the block bit line driver for the selected block to follow the output signal from the selected core cell. Thus, the output signal of the selected core cell automatically helps minimize crowbar current in the bit line driver for the selected block.

Thus, in a four block system comprising 256 columns wherein a single bit line block is selected, crowbar current is minimized for 3×256 bit line block drivers.

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 1:
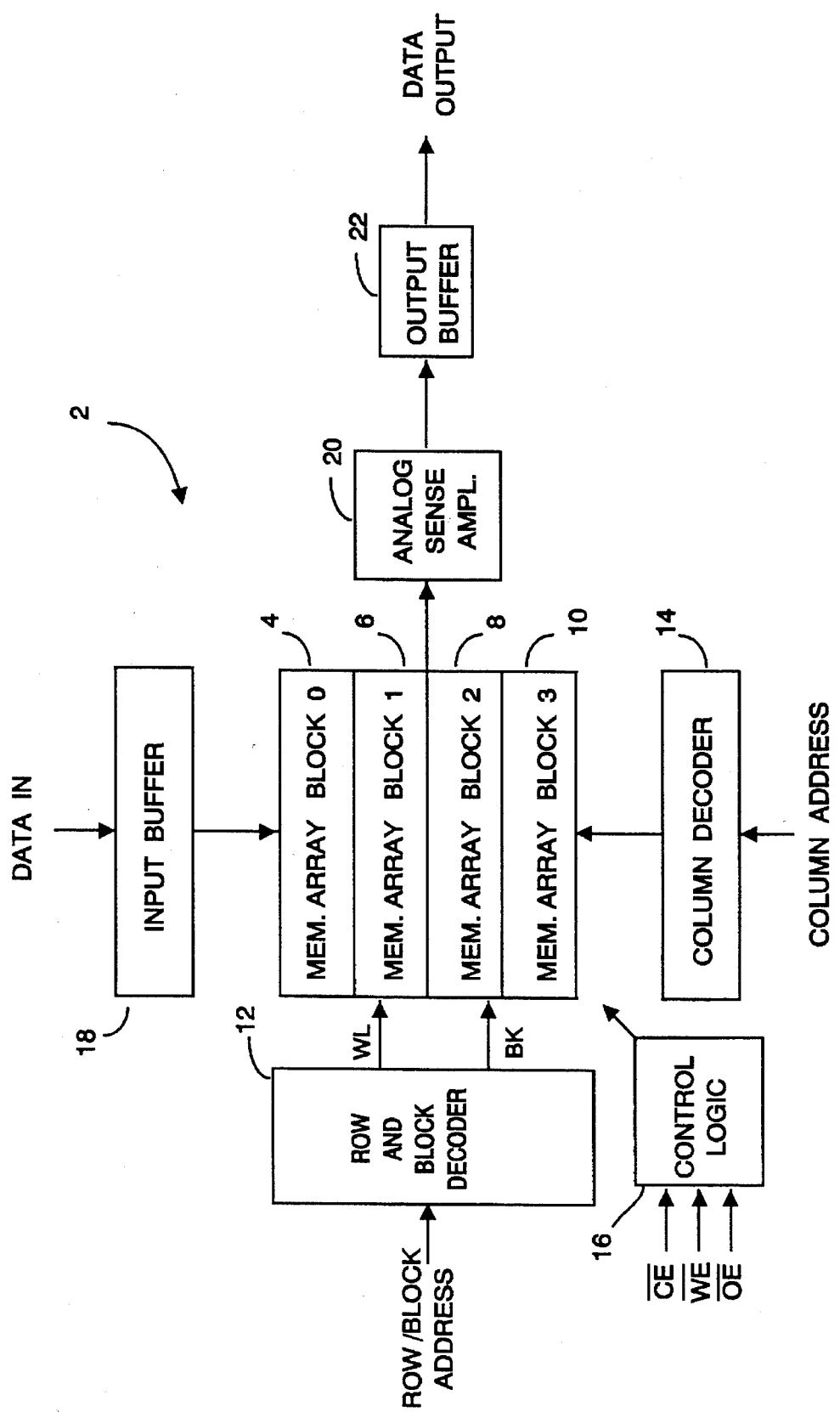
FIG. 1 is a block diagram of a conventional non-retargetable SRAM system employing analog sense amplifiers, according to the prior art.
Figure 2:
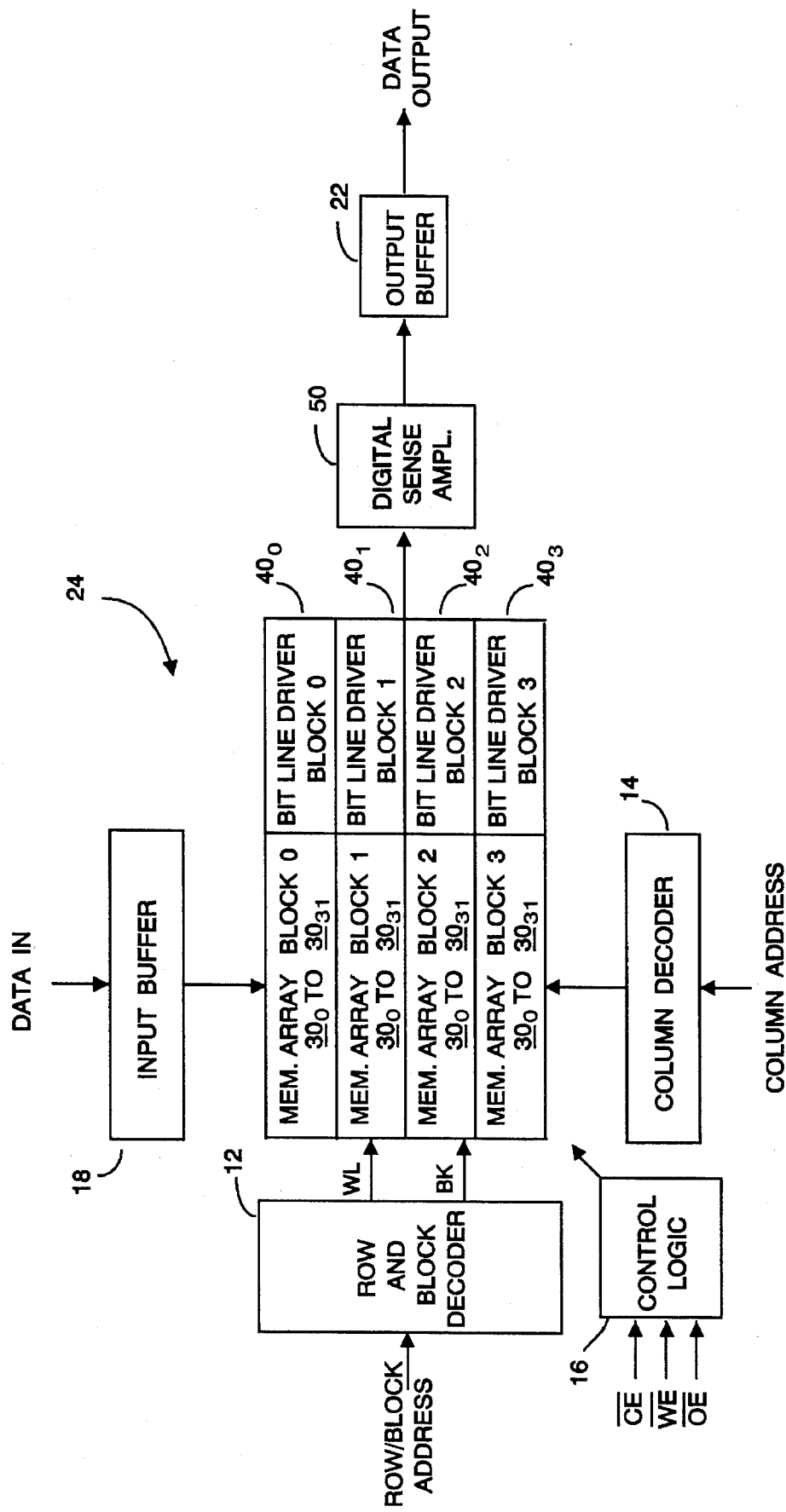
FIG. 2 is a block diagram of a retargetable SRAM system employing digital sense amplifiers, according to the present invention.

As shown in FIG. 2, an SRAM memory system 24 includes a digital, rather than analog, sense amplifier 50. In contrast to their analog counterparts, digital sense amplifier circuits require no fine tuning or dynamic range balancing, and are considerably less critical in their design criteria. As such, providing system 24 with digital rather than analog sense amplifiers permits implementing a retargetable design.

However, because digital sense amplifiers do not operate in a differential mode they are less sensitive than analog sense amplifiers, and cannot sense the proper "0" or "1" level stored in an addressed memory cell as rapidly as can an analog sense amplifier. Rather than sensing voltage differentials of perhaps 100 mV or less, digital sense amplifiers require that the input voltage level transition almost "rail-to-rail", e.g., almost from a full "1" level to a full "0" level, or vice versa, a difference of at least 1 V, before the proper "0" or "1" level can be sensed.

To compensate for the decreased sensitivity and operating speed of digital sense amplifier 50, it is useful, therefore, to minimize the capacitive loading presented to the input of the digital sense amplifier. Since the digital sense amplifier slew rate (dv/dt) is proportional to (i/C), where i is current into or out of buss load capacitance C. Thus, decreasing C increases dv/dt for a given level of current i.

Accordingly, the present invention preferably divides the memory array into a plurality M of memory block storage units, wherein each block storage unit includes a plurality N of identical memory core cells 30. FIG. 2 depicts the example of a system with M=4 memory block storage unit, blocks 0–3, with each memory block storage unit containing 32 rows of cells (N+1=32), namely cell $30_0$ through cell $30_{31}$. As is more apparent from FIG. 4, such sectioning advantageously reduces the load capacitance per bit line section, as seen by the input of the digital sense amplifier 50.

To further enhance voltage slew rate, the present invention preferably provides a single-ended (e.g., not differential) bit line driver for each memory block. Thus, as shown in FIG. 2, the output of block storage unit 0 is coupled to a block 0 bit line driver $40_0$; block storage unit 1 similarly is coupled to a block 1 bit line driver $40_1$, and so on. Because output transistors associated with block bit line drivers are larger than the various core cell output transistors, they can sink or source more current, thereby enhancing the voltage slew rate dv/dt.

Although FIG. 2 provides a dedicated block bit line driver for each block storage unit, in some applications, the block bit line drivers may be dispensed with entirely. In such applications, the selected block storage unit output would be coupleable to the input of the digital sense amplifier 50. Of course, voltage slew rate would suffer as the smaller sized core cell transistors do not sink or source as much current as block bit line drive transistors.

Row and block decoder 12 determines from a block select signal which of the various block storage units is to be selected, (e.g., block 0, block 1, etc.). Within that selected block storage unit, decoded row and column signals can uniquely identify the memory core cell whose contents are to be read or written to. In FIG. 2, for example, if SRAM system 24 includes 128 rows and 256 columns, upon sectioning, there could be four block storage units of 32 rows each, arranged in 256 columns. Thus if block storage unit 0 is enabled, for each of the unselected three blocks, there will an unselected block bit line driver for each of 256 columns, or a total of 3×256=768 unselected block bit line drivers.

To recapitulate thus far, the system of FIG. 2 sections the memory array into block storage units, each of which preferably is coupleable to a block line driver unit. Further, digital sense amplifiers are provided for each data output in the system. As will be described shortly, the present invention advantageously provides a mechanism to minimize block bit line driver unit crowbar current during power-up of SRAM system 24 (see FIGS. 5 and 6). Without such mechanism, during power-up the block bit line drivers for the unselected blocks may be subjected to substantial crowbar current. For the specific example of FIG. 2, one block is selected, and thus for the unselected three blocks, there are 768 unselected block bit line drivers (e.g., 3×256). In the aggregate, this crowbar current can be excessive.

Figure 3A:
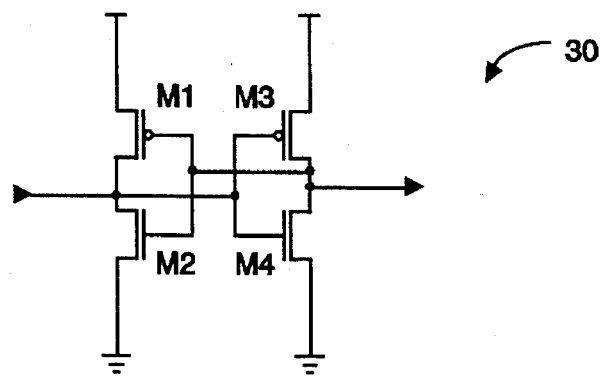
FIG. 3A is a schematic of a typical SRAM latching core cell, according to the present invention.
Figure 3B:
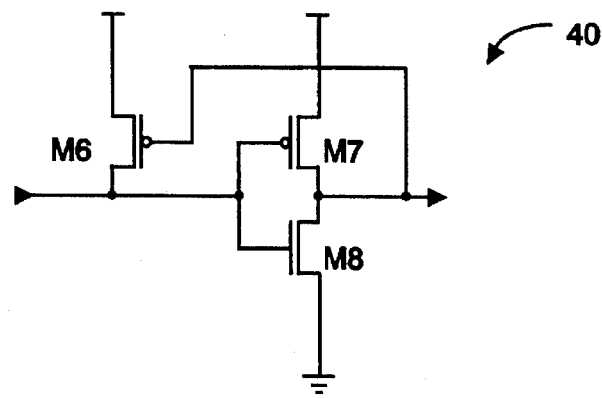
FIG. 3B is a schematic of a typical single-ended block bit line driver, according to the present invention.
Figure 3C:
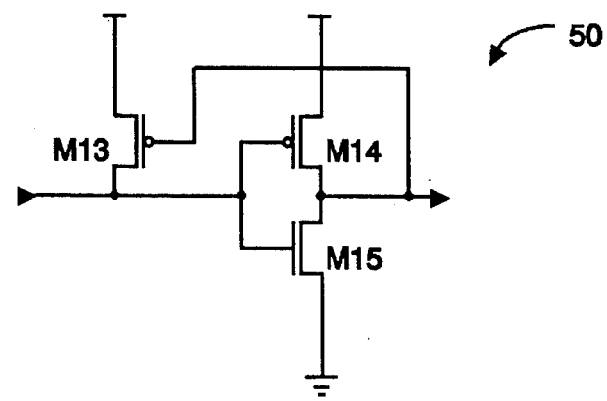
FIG. 3C is a schematic of a typical digital sense amplifier, according to the present invention.

FIGS. 3A, 3B, 3C depict some of the building blocks with which system 24 preferably is implemented. FIG. 3A depicts a typical core cell 30, wherein MOS transistors M1, M2, M3, M4 are coupled between the upper power supply and lower power supply (typically ground) to form cross-coupled latch inverters. Those skilled in the art will appreciate that an incoming "1" or "0" digital signal, coupled to the gate leads of transistors M3, M4 will produce an inverted output signal at the drain-source lead junction of transistors M3, M4, which output signal is fed back to the input gate leads of transistors M1, M2. Thus, M1, M2, M3, M4 latchingly retain (e.g., store) the complement of whatever digital signal is provided as input. Of course other latch memory core cell configurations could be used instead, and devices other than MOS transistors may be used to implement a memory core cell for use with the present invention.

As noted, one limitation of the core cell 30 shown in FIG. 3A is that transistors M1, M2, M3, M4 are generally small size devices that cannot source or sink substantial drain current. Of course, increasing the size of M3, M4 would increase their drain current capability, and enhance voltage slew rate. However, it will be appreciated that in memory system 24, a relatively great number of core cells will be present, and thus a great many transistors M1, M2, M3, M4 for whose fabrication a considerable IC area may be required. Thus, because M1, M2, M3, M4 will usually be fabricated as small devices, core cell 30 cannot readily voltage slew between "1" and "0" states (or vice versa) when coupled to a capacitive output load.

FIG. 3B depicts a single-ended block bit line driver 40 comprising MOS transistors M6, M7 and M8. Those skilled in the art will appreciate that an input signal presented to the gate leads of transistors M7, M8 will be inverted at the source-drain juncture of these transistors, e.g., the block bit line driver output. The inverted signal is returned from the block bit line driver output to the gate lead of transistor M6, which transistor M6 helps pull-up the gate leads of M7, M8 when the input signal to block bit line driver 40 is a "1".

Typically, transistors M7, M8 are sized larger than the core cell transistors M1, M2, M3, M4 (see FIG. 3A), which enables block bit line driver 40 to voltage slew more rapidly in the presence of output capacitive loading. Of course, other digital sense amplifier configurations could be used, and devices other than MOS transistors may be used to fabricate block bit line drivers.

Ideally, transistors M7 and M8 should operate in complementary fashion such that there should be no steady-state current path between the upper power supply and the lower power supply (typically ground). Thus, when M7 is on, M8 should be off, and vice versa. However, at power-up, the voltage level at the input of the unselected block bit line driver may temporarily float at a voltage intermediate to a "1" and "0" voltage level. This can cause the output from a block bit line driver 40 to temporarily float at an intermediate voltage level. Further, it will be appreciated that a large capacitive load coupled to the output of the block bit line driver can prevent the output level from rapidly attaining a full "1" or "0" level at power-up.

As above described, at power-up, transistors M7 and M8 may simultaneously be on, with an output level that floats at an magnitude that is intermediate to a "0" and "1" voltage level. Eventually the presence of transistor M6 will cause the block bit line driver output to attain a proper "1" or "0" level, but before that occurs, excess current may be drawn through transistors M7 and M8 for an excessively long period of time. This excessive current condition is commonly referred to as power-up crowbar current.

The magnitude of the crowbar current may be ten times the normal transient current through these transistors, and the duration of the crowbar current may be ten to one hundred times the duration of normal transient current. In an SRAM having access times on the order of a few ns, M7–M8 transient current of 10 µA lasting for perhaps 100 ns may increase to 100 µA, lasting for perhaps 5 ms. In a memory system containing a thousand or several thousand block bit line drivers, the aggregate crowbar current can be appreciable.

In addition to stressing transistors M7, M8, crowbar current can stress the metal traces carrying operating voltage on the integrated circuit containing core cell 30. Further, the various metal traces for local bit line traces (see FIG. 4) may also be stressed. The various metal trace stressing can result in metal migration, which implies damage to the traces themselves. While providing wider metal traces can reduce migration, doing so demands increased area for the traces themselves, which increased area may simply not be available on the integrated circuit chip. As will be described later with respect to FIGS. 5 and 6, the present invention preferably provides a mechanism to minimize power-up crowbar current.

FIG. 3C depicts a digital sense amplifier 50, comprising MOS transistors M13, M14 and M15. As shown, the configuration of sense amplifier 50 may be identical to that of bit line driver 40, except that transistors M13, M14, M15 may be sized differently. In FIG. 3C, sense amplifier 50 inverts the signal presented to its input. Of course, other configurations for sense amplifiers could be used, and devices other than MOS transistors could be used. While sense amplifier 50 may be subject to crowbar current, there are relatively few sense amplifiers, one per data output, compared to the far greater number of block bit line drivers.

Figure 4:
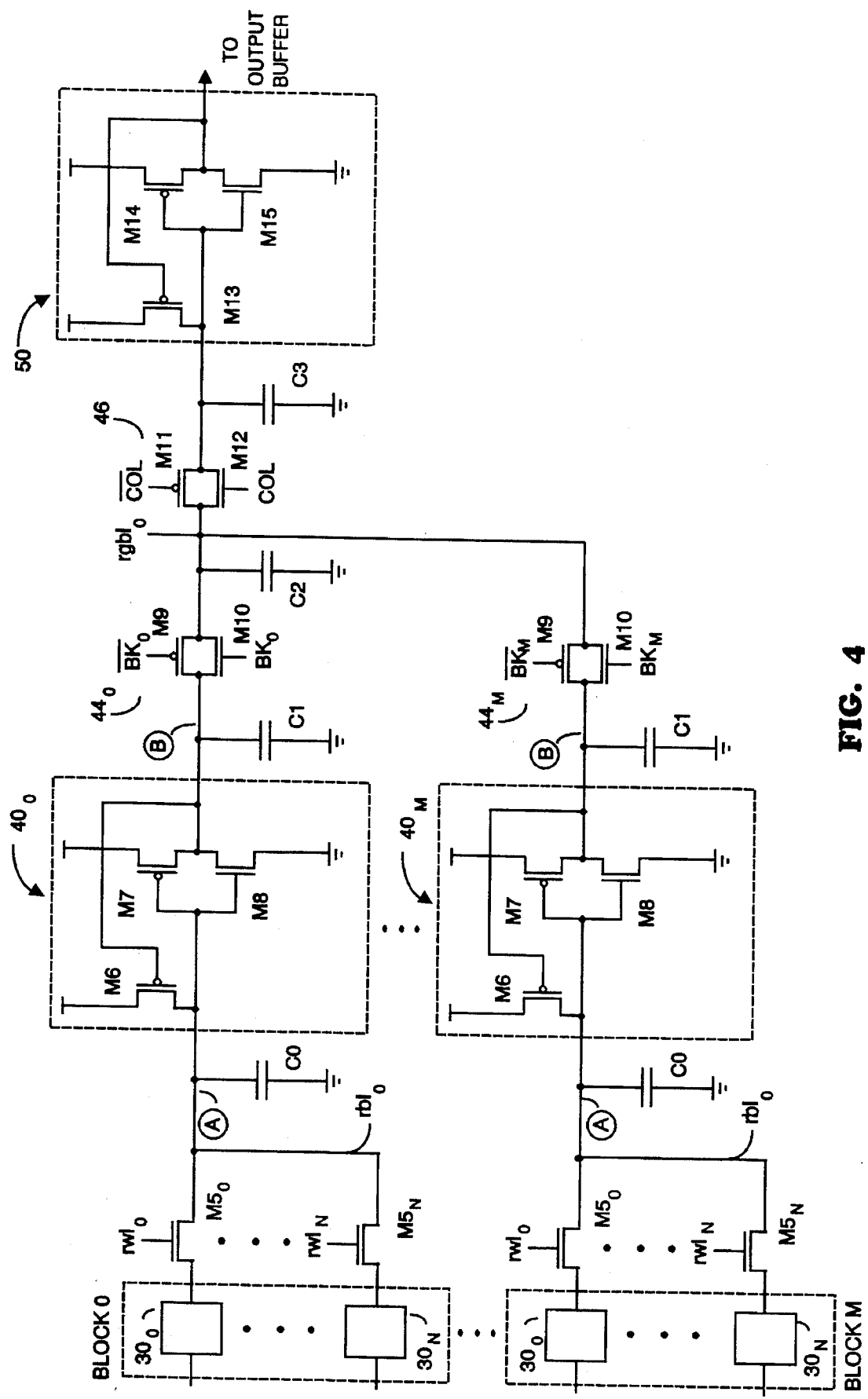
FIG. 4 is a schematic representation of the read path for a retargetable SRAM system, according to the present invention.

FIG. 4 shows a portion of system 24, comprising M memory blocks, each containing N+1 rows of SRAM core cells, and associated circuitry for a single column. Two memory blocks, block 0 and block M, are shown, with the configuration of FIG. 4 being similar to the block diagram of FIG. 2, where M may but need not equal four, and where N+1 need not be 32. As will now be described, the configuration of FIG. 4 can exhibit excess crowbar current at power-up, which crowbar current is minimized in the embodiments of FIGS. 5 and 6.

In FIG. 4, memory array block 0 and block M each comprise thirty-two core cells, denoted $30_0 \ldots 30_N$, wherein each core cell preferably comprises four transistors M1, M2, M3, M4 configured as cross-coupled inverters as shown in FIG. 3A.

Within a memory block unit, a pass transistor (e.g., $M5_0 \ldots M5_N$) is series coupled between the output of an associated core cell (e.g., $30_0 \ldots 30_N$) and the input of the block bit line driver, e.g., bit line driver $40_0$ for block 0. The various block bit line drivers $40_0$ through $40_M$ preferably are as described with respect to FIG. 3B.

In FIG. 4, whether a given pass transistor $M5_N$ turns on is determined by a row word line signal $rwl_N$ coupled to the pass transistor's gate lead. Decoder 12 (see FIG. 2) provides row word line output signals ($rwl_N$) to the various pass transistors $M5_N$ such that within a selected memory unit block, the row word line signal="1" for the selected row, and is "0" for the remaining unselected rows. The row word line signal is also "0" for all rows of the unselected memory unit blocks.

Thus, if core cell $30_0$ in row 0 of block 0 is selected to be read, $rwl_0$="1", which turns on pass transistor $M5_0$, coupling the "0" or "1" signal stored in core cell $30_0$ to the input of the block 0 bit driver $40_0$. The output signals stored in the remaining core cells in the block are not coupled to the block bit driver because the associated pass transistors are turned off by the "0" signals coupled to the gates of the associated pass transistors.

The output leads from the various pass transistors $M5_N$ are coupled to the input of the associated block bit line driver through a metal trace that defines a local read bit line for a given column, e.g., $rbl_0$ for column 0. As noted, among the metal traces that can be detrimentally affected by power-up crowbar current are the various local read bit lines for the columns in the system.

For ease of reference, the input and output ports of each block bit line driver will be referred to as node A and node B respectively. As shown in FIG. 4, the local read bit line trace sees an effective load capacitance C0 at the bit line driver input node A, and an effective load capacitance C1 at the bit line driver output node B. Typically, buss capacitances C0 and C1 are each in the 0.5 pf to 5 pf range.

With further reference to FIG. 4, output signals from the various block bit line drivers are coupled to the input of an associated block select transmission gate $44_M$ comprising complementary transistors M9, M10. If the appropriate block signal (BK) is presented to the gate leads of the transmission gate, the transmission gate passes whatever "0" or "1" signal is present at node B, otherwise no signal transmission through the transmission gate occurs. For the particular NMOS and PMOS transistor configuration shown in FIG. 4, when BK="1", transmission occurs. Thus, if memory block 0 is selected, $BK_0$="1", but $BK_2 \ldots BK_M$ are all "0".

In this fashion, only a single memory block is selected, and the signal read from the selected core cell within the selected block is passed on to the input of a column select transmission gate 46, comprising complementary transistors M11 and M12. The various inputs to the column select transmission gate 46 represent a global read bit line for the given column, e.g., $rgbl_0$ for column 0. The various metal traces implementing the global bit lines in the system may also be detrimentally affected by crowbar current.

Assertion of a column select signal ("COL") causes the selected block and core cell therein to be coupled via the block bit line driver to the input of digital sense amplifier 50. The effective buss capacitance at the input and output side of the column select transmission gate, C2 and C3 respectively, are typically each in the 0.5 pf to 5 pf range.

Operation of digital sense amplifier 50 is as has been described with respect to FIG. 3B. The sense amplifier output is typically coupled to an output buffer 22, as shown in FIG. 2.

While the SRAM system of FIG. 4 is retargetable, the various block bit line drivers can experience crowbar current at power-up, with resultant metal trace damage, and stress to the various M7, M8 transistors. As described earlier, input node A and output node B at the input and output of each unselected block bit line driver unit may impermissibly float temporarily during power-up. The crowbar current resulting from a single block bit line driver may be perhaps 100 µA with a 5 ms duration. However, an M=4 system 24 in FIG. 2 will include (M−1) ×256 or 768 block bit line drivers associated with unselected blocks, and may experience 76.8 mA aggregate crowbar current. Of course, larger systems may include considerably more block storage units, with correspondingly greater crowbar current.

Figure 5:
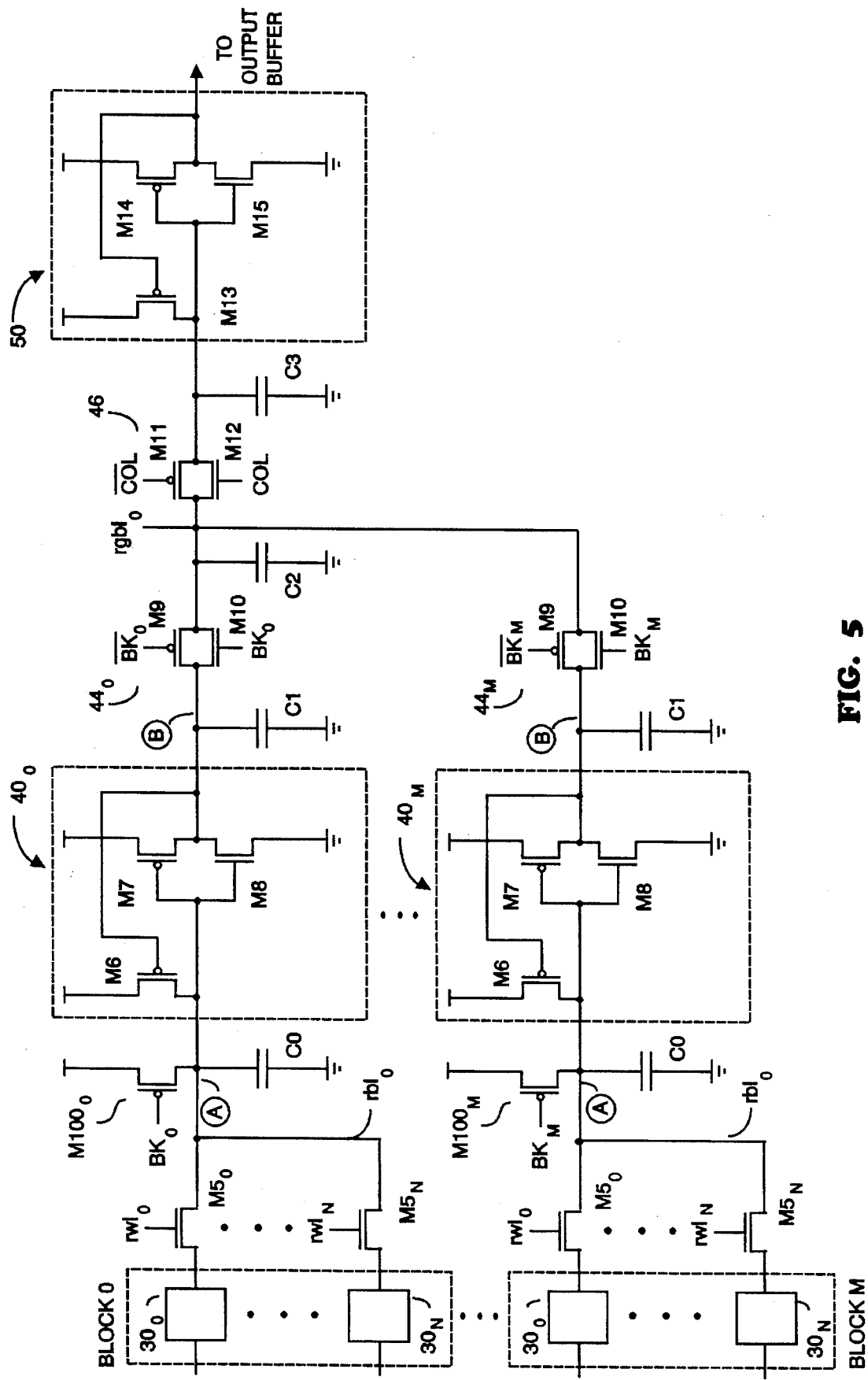
FIG. 5 is a schematic representation of the read path for a retargetable SRAM system with reduced crowbar current, according to the present invention.

FIG. 5 depicts one embodiment wherein power-up crowbar current for the various unselected block storage units and their associated block bit line drivers is minimized. FIG. 5 is similar to FIG. 4, except that a pull-up PMOS transistor M100 is coupled between the node A input to each block bit line driver and the upper power supply to the system. The gate lead of each of these pull-up transistors is coupled to the corresponding block select signal.

In FIG. 5, for all unselected block storage units, the corresponding block select signal $BK_M$=0, which turns on the associated pull-up transistors. This effectively forces node A to rapidly achieve a digital "1" voltage level, and prevents the node from simply floating at an indeterminate state. Because node A cannot float, output node B cannot float and will rapidly achieve a digital "0" voltage level due to the inverting action of the block bit line driver for the unselected block. For the selected block, the corresponding block select signal is a "1", which does not turn on the associated pull-up transistor. For system 2, where four block storage units are shown, for the one selected block, e.g., block 0, the associated pull-up transistor $M100_0$ will remain off, but for the three unselected blocks, the associated pull-up transistors $M100_1$, $M100_2$ and $M100_3$ will be turned on. In a 256 column configuration, the simple addition of a PMOS transistor M100 to each block bit line driver, as shown, will effectively minimize crowbar current in (M−1)× 256 or 768 block bit line drivers for M=4.

Figure 6:
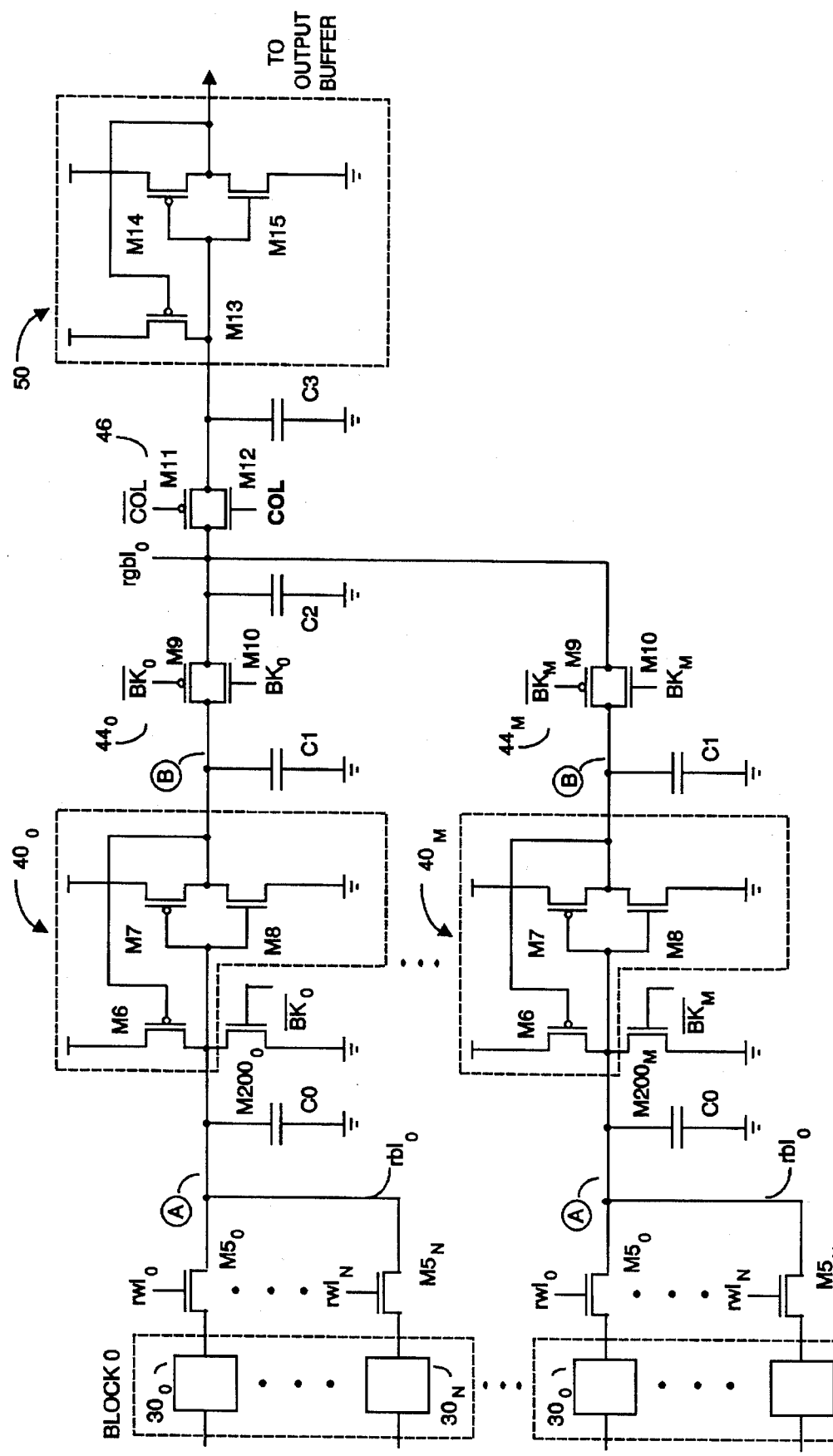
FIG. 6 is a schematic representation of the read path for a retargetable SRAM system with reduced crowbar current according to an alternative embodiment of the present invention.

FIG. 6 shows a second embodiment wherein power-up crowbar current for the various unselected blocks and their associated block bit line drivers is minimized using NMOS transistors M200. FIG. 6 is similar to FIG. 4, except that a pull-down NMOS transistor M200 is coupled between the node A input to each block bit line driver and the lower system power supply, which is shown as ground. The gate lead of each of these pull-down transistors is coupled to the corresponding complement of the block select signal.

Similar to what has been described with respect to FIG. 5, for all unselected block storage units, the corresponding complement block select signal $\overline{BK_M}$="1", which turns on the associated pull-down transistors, effectively forcing node A to rapidly achieve a digital "0" voltage level. Because node A cannot float, crowbar current is thus minimized. Similarly, output node B will not float, being instead the complement of node A. For the selected block, the corresponding complement block select signal is a "0", which does not turn on the associated pull-down transistor.

In general, the NMOS pull-down transistor configuration of FIG. 6 may be preferred to the PMOS pull-up transistor configuration of FIG. 5. This follows because NMOS transistors M200 can carry more current per the same IC chip area than PMOS transistors M100 due to the enhanced mobility of electrons compared to holes. Of course in either embodiment, devices other than MOS transistors could be used to achieve pull-up or pull-down of node A. Modifications and variations may be made to the disclosed embodiments without departing from the subject and spirit of the invention as defined by the following claims.

What is claimed is:

1. A retargetable static random access memory (SRAM) system, comprising:

at least one block storage unit including a plurality of SRAM core cells, wherein each one of said core cells associated with said block storage unit is addressably selectable by specifying row, column and block information for accessing a digital bit storable therein, which digital bit may be output on a data output port;

a block bit line driver unit for each said block storage unit, each said block bit line driver unit having an input addressably coupleable to an output of a selected one of said SRAM core cells by specifying a row line address for the core cell, each said block bit line driver further having an output selectably coupleable, by enabling block select and column select signals, to an input of a digital sense amplifier; and for each said data output port, a digital sense amplifier whose input is switchably coupleable through a selected said block bit line driver unit to a selected one of said SRAM core cells within a selected said block storage unit, wherein said digital sense amplifier outputs a digital signal as a function of a said digital bit stored in said selected core cell.

2. The system of claim 1, wherein each said block bit line driver unit includes means for reducing power-up crowbar current when a said block bit line driver unit is not selected for access by said system.

3. The system of claim 2, wherein said means for reducing power-up crowbar current includes a transistor coupled in series between an input port of each said bit line driver unit and a voltage level whose magnitude constitutes a digital "0" or a digital "1";

each said transistor including an input lead coupled to a said block select signal for an associated said block storage unit;

wherein for each unselected said block storage unit, an associated said transistor is turned on, preventing said input port of said unselected block bit line driver unit from floating at an undetermined voltage level.

4. The system of claim 3, wherein said transistor is a MOS transistor whose said input lead is a gate lead, and wherein said voltage level is selected from the group consisting of (i) an upper power supply voltage, (ii) a voltage level approximating a digital "1", (iii) a lower power supply voltage, and (iv) a voltage level approximating a digital "0".

5. The system of claim 4, wherein said MOS transistor is selected from the group consisting of (i) a PMOS transistor coupled between a said input port and a source of upper power supply voltage providing operating voltage to said system, and (ii) an NMOS transistor coupled between a said input port and a source of lower power supply voltage providing operating voltage to said system.

6. The system of claim 1, wherein each said digital sense amplifier includes a PMOS-NMOS inverter coupled in series between an upper power supply and a lower power supply providing operating voltage to said system, and a PMOS transistor coupled between said upper power supply and an input of said inverter, said PMOS transistor having a gate lead coupled to an output of said inverter, wherein said digital sense amplifier input and output are respectively said inverter input and output.

7. The system of claim 2, wherein each said bit line driver unit includes an inverter coupled in series between an upper power supply and a lower power supply providing operating voltage to said system, and a PMOS transistor coupled between said upper power supply and an input of said inverter and having a gate lead coupled to an output of said inverter, wherein said bit line driver unit input and output are respectively said inverter input and output.

8. The system of claim 1, wherein each one of said SRAM core cells includes first and second PMOS-NMOS inverters series-coupled between an upper power supply and a lower power supply, each said power supply providing operating voltage to said system, wherein an output of said second inverter is coupled to an input of said first inverter, and wherein an output of said first inverter is coupled to an input of said second inverter.

9. The system of claim 3, wherein said system includes four said block storage units, each including thirty-two said core cells, four said block bit line driver units, and four said means for reducing power-up crowbar current.

10. A method for implementing a retargetable static random access memory (SRAM) system having reduced crowbar current, comprising the following steps:

(a) providing at least one block storage unit including a plurality of SRAM core cells, wherein each one of said core cells associated with said block storage unit is addressably selectable by specifying row, column and block information for accessing a digital bit storable therein, which digital bit may be output on a data output port;

(b) providing a block bit line driver unit for each said block storage unit, each said block bit line driver unit having an input addressably coupleable to an output of a selected said core cell by specifying a row line address for said core cell;

(c) for each said data output port, providing a digital sense amplifier having an input switchably coupleable to an output of a selected said block bit line driver for reading a digital bit stored in a selected said core cell within a selected said block storage unit; and (d) for each said block bit line driver unit, providing a means for reducing power-up crowbar current when a said block bit line driver unit is not selected for access by said system.

11. The method of claim 10, wherein step (d) includes coupling a transistor in series between an input port of each said bit line driver unit and a voltage level whose magnitude constitutes a digital "0" or a digital "1";

each said transistor including an input lead coupled to a said block select signal for an associated said block storage unit;

wherein for each unselected said block storage unit, an associated said transistor is turned on, preventing said input port of said unselected block bit line driver unit from floating at an undetermined voltage level.

12. The method of claim 10, wherein step (d) includes coupling a MOS transistor, whose said input lead is a gate lead, in series between an input port of each said bit line driver unit and a source of power supply operating voltage, said MOS transistor selected from the group consisting of (i) a PMOS transistor coupled between a said input port and a source of upper power supply voltage providing operating voltage to said system, and (ii) an NMOS transistor coupled between a said input port and a source of lower power supply voltage providing operating voltage to said system.

13. The method of claim 10, wherein step (c) includes coupling a PMOS-NMOS inverter in series between an upper power supply and a lower power supply providing operating voltage to said system, and a PMOS transistor coupled between said upper power supply and an input of said inverter, said PMOS transistor having a gate lead coupled to an output of said inverter, wherein said digital sense amplifier input and output are respectively said inverter input and output.

14. The method of claim 10, wherein step (b) includes coupling a PMOS-CMOS inverter in series between an upper power supply and a lower power supply providing operating voltage to said system, and a PMOS transistor coupled between said upper power supply and an input of said inverter and having a gate lead coupled to an output of said inverter, wherein said bit line driver unit input and output are respectively said inverter input and output.

15. The method of claim 10, wherein at step (a) each said SRAM core cell includes first and second PMOS-NMOS inverters series-coupled between an upper power supply and a lower power supply, each said power supply providing operating voltage to said system, wherein an output of said second inverter is coupled to an input of said first inverter, and wherein an output of said first inverter is coupled to an input of said second inverter.

16. The system of claim 1, wherein said digital sense amplifier is single-ended.

17. The method of claim 10, wherein at step (c), each said digital sense amplifier is single-ended.

18. The method of claim 11, wherein at step (d), said voltage level is selected from the group consisting of (i) an upper power supply voltage, (ii) a voltage level approximating a digital "1", (iii) a lower power supply voltage, and (iv) a voltage level approximating a digital "0".

* * * * *